United States Patent
Shibasaki

(10) Patent No.: US 10,015,005 B2
(45) Date of Patent: Jul. 3, 2018

(54) CLOCK DATA RECOVERY CIRCUIT, ELECTRONIC DEVICE, AND CLOCK DATA RECOVERY METHOD

(71) Applicant: FUJITSU LIMITED, Kawasaki-shi, Kanagawa (JP)

(72) Inventor: Takayuki Shibasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/666,823

(22) Filed: Aug. 2, 2017

(65) Prior Publication Data
US 2018/0054296 A1    Feb. 22, 2018

(30) Foreign Application Priority Data
Aug. 18, 2016 (JP) ................... 2016-160800

(51) Int. Cl.
*H04L 7/00* (2006.01)
*H04L 7/033* (2006.01)

(52) U.S. Cl.
CPC .................. *H04L 7/033* (2013.01)

(58) Field of Classification Search
CPC ....... H04L 7/0008; H04L 7/02; H04L 7/0331; H04L 7/0087; H04L 7/0034; H04L 25/03248; H04L 2007/0057; H04L 7/033; H04B 1/163
USPC .......... 375/354, 226, 373, 376; 327/97, 156; 455/103, 127, 307
See application file for complete search history.

(56) References Cited

U.S. PATENT DOCUMENTS

| | | | |
|---|---|---|---|
| 9,059,837 B1* | 6/2015 | Tsunoda | H04L 7/033 |
| 9,148,276 B2* | 9/2015 | Chang | H04L 7/0331 |
| 2007/0177703 A1 | 8/2007 | Senba | |
| 2015/0098527 A1* | 4/2015 | Wang | H04L 7/033 375/316 |
| 2016/0164558 A1* | 6/2016 | Elzeftawi | H03B 19/12 455/192.1 |

FOREIGN PATENT DOCUMENTS

JP    2005-252723    9/2005

OTHER PUBLICATIONS

Ansgar Pottbacker et al. "A Si Bipolar Phase and Frequency Detector IC for Clock Extraction up to 8Gb/s", IEEE Journal of Solid-State Circuits, vol. 27, No. 12, 1992, 5 pages.

* cited by examiner

*Primary Examiner* — Khai Tran
(74) *Attorney, Agent, or Firm* — Oblon, McClelland, Maier & Neustadt, L.L.P.

(57) ABSTRACT

A clock data recovery circuit includes an oscillator that outputs a first clock and a second clock having the same frequency and a different phase, and a feedback circuit that controls the oscillator so as to synchronize input data and the first clock, the feedback circuit including a controller that controls the oscillator in response to a frequency difference signal and a phase difference signal, a first difference detector that generates a first difference signal, a second difference detector that generates a second difference signal, and a frequency detector that outputs the frequency difference signal based on the first difference signal and the second difference signal, the frequency detector including a state detector that detects one of the rising state or the falling state, and a state holder that holds a state detected in the first phase and outputs the frequency difference signal.

10 Claims, 19 Drawing Sheets

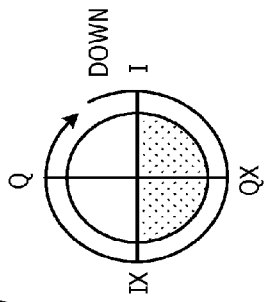
FIG. 5A
FIG. 5B
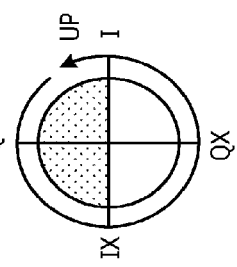
FIG. 5C
FIG. 5D

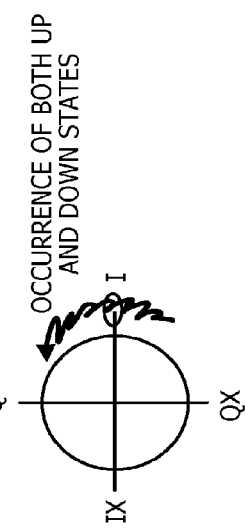

FIG. 7A

| PDI | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 |
|---|---|---|---|---|---|---|---|---|---|---|---|---|---|---|---|---|---|---|---|---|---|---|---|---|---|---|---|---|---|---|
| PDQ | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| L11 | L | R | L | R | L | R | L | R | L | R | L | R | L | R | L | R | L | R | L | R | L | R | L | R | L | R | L | R | L | R |
| L11 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| L21 | R | L | R | L | R | L | R | L | R | L | R | L | R | L | R | L | R | L | R | L | R | L | R | L | R | L | R | L | R | L |
| L21 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| FD | S | S | S | S | S | S | S | S | S | S | S | S | S | S | S | S | S | S | S | S | S | S | S | S | S | S | S | S | S | S |

FIG. 7B

| PDI | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 |
|---|---|---|---|---|---|---|---|---|---|---|---|---|---|---|---|---|---|---|---|---|---|---|---|---|---|---|---|---|---|---|
| PDQ | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| L11 | L | R | L | R | L | R | L | R | L | R | L | R | L | R | L | R | L | R | L | R | L | R | L | R | L | R | L | R | L | R |
| L11 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| L21 | R | L | R | L | R | L | R | L | R | L | R | L | R | L | R | L | R | L | R | L | R | L | R | L | R | L | R | L | R | L |
| L21 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| FD | U | U | U | U | U | U | U | U | U | U | U | U | U | U | U | U | U | U | U | U | U | U | U | U | U | U | U | U | U | U |

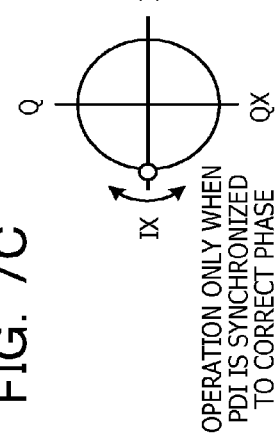

FIG. 7C
OPERATION ONLY WHEN PDI IS SYNCHRONIZED TO CORRECT PHASE

FIG. 7D
OPERATION WHEN BOTH FDO AND PDI ARE SYNCHRONIZED TO INCORRECT PHASE

| PDI | PDQ | L11 | L11 | L12 | L12 | L13 | L13 | L21 | L21 | L22 | L22 | L23 | L23 | FD | cll1 | cll2 | dh |  |
|---|---|---|---|---|---|---|---|---|---|---|---|---|---|---|---|---|---|---|
| 1 | 1 | R | 1 | L | 0 | R | 1 | L | 1 | R | 1 | L | 1 | U | 1 | 0 | 0 | |
| 0 | 1 | L | 0 | R | 0 | L | 1 | R | 1 | L | 1 | R | 1 | S | 0 | 0 | 0 | |
| 0 | 1 | L | 0 | R | 0 | L | 1 | R | 1 | L | 1 | R | 1 | S | 0 | 0 | 0 | |
| 0 | 0 | L | 0 | R | 0 | L | 1 | R | 0 | L | 1 | R | 1 | S | 0 | 0 | 0 | |
| 0 | 1 | L | 0 | R | 0 | L | 1 | R | 1 | L | 1 | R | 1 | S | 0 | 0 | 0 | |
| 0 | 0 | L | 0 | R | 0 | L | 1 | R | 0 | L | 1 | R | 1 | S | 0 | 0 | 0 | AVOID FALSE DETECTION |
| 0 | 0 | L | 0 | R | 0 | L | 1 | R | 0 | L | 1 | R | 1 | S | 0 | 0 | 1 | |
| 1 | 0 | R | 0 | L | 1 | R | 1 | L | 0 | R | 0 | L | 1 | S | 0 | 0 | 1 | |
| 0 | 0 | L | 0 | R | 0 | L | 0 | R | L | 1 | L | 1 | R | 1 | S | 0 | 0 | 0 |
| 1 | 0 | R | 0 | L | 0 | R | R | 0 | L | 1 | R | 1 | L | 1 | U | 0 | 0 | 0 |
| 1 | 0 | R | 0 | L | 0 | R | R | 0 | L | 1 | R | 1 | L | 1 | U | 0 | 0 | 0 |
| 1 | 1 | R | 1 | L | 0 | R | R | 0 | L | 1 | R | 1 | L | 1 | U | 0 | 0 | 0 |
| 1 | 0 | R | 0 | L | 0 | R | 0 | L | 1 | R | 1 | L | 1 | U | 1 | 0 | 0 | |
| 1 | 1 | R | 1 | L | 0 | R | 0 | L | 1 | R | 1 | L | 1 | U | 1 | 0 | 0 | |
| 1 | 1 | R | 1 | L | 0 | R | 0 | L | 1 | R | 1 | L | 1 | U | 0 | 0 | 0 | |
| 0 | 1 | L | 0 | R | 0 | L | 0 | R | 1 | L | 1 | R | 1 | S | 1 | 0 | 0 | HOLD |
| 1 | 1 | R | 1 | L | 0 | R | 0 | L | 1 | R | 1 | L | 1 | U | 1 | 0 | 0 | |
| 0 | 1 | L | 0 | R | 0 | L | 1 | R | 1 | L | 1 | R | 1 | S | 0 | 0 | 0 | |
| 0 | 1 | L | 0 | R | 0 | L | 1 | R | 1 | L | 1 | R | 1 | S | 0 | 0 | 0 | |
| 0 | 0 | L | 0 | R | 0 | L | 1 | R | R | 0 | L | 1 | R | 1 | S | 0 | 0 | 0 |
| 0 | 1 | L | 0 | R | 0 | L | 1 | R | 1 | L | 1 | R | 1 | S | 0 | 0 | 0 | |
| 0 | 0 | L | 0 | R | 0 | L | 1 | R | R | 0 | L | 1 | R | 1 | S | 0 | 0 | 0 | AVOID FALSE DETECTION |
| 0 | 0 | L | 0 | R | 0 | L | 1 | R | 0 | L | 1 | R | 1 | S | 0 | 0 | 1 | |
| 1 | 0 | R | 0 | L | 1 | R | 1 | L | 0 | R | 0 | L | 1 | S | 0 | 0 | 1 | |
| 0 | 0 | L | 0 | R | 0 | L | 0 | R | 0 | L | 1 | R | 1 | S | 0 | 0 | 0 | |
| 1 | 0 | R | R | 0 | L | 0 | R | 0 | L | 1 | R | 1 | L | 1 | U | 0 | 0 | 0 |
| 1 | 0 | R | R | 0 | L | 0 | R | R | 0 | L | 1 | R | 1 | L | 1 | U | 0 | 0 | 0 |
| 1 | 1 | R | 1 | L | 0 | R | R | 0 | L | 1 | R | 1 | L | 1 | U | 1 | 0 | 0 |
| 1 | 0 | R | R | 0 | L | 0 | R | R | 0 | L | 1 | R | 1 | L | 1 | U | 0 | 0 | 0 |
| 1 | 1 | R | 1 | L | 0 | R | R | 0 | L | 1 | R | 1 | L | 1 | U | 1 | 0 | 0 |
| 1 | 1 | R | 1 | L | 0 | R | 0 | L | 1 | R | 1 | L | 1 | U | 1 | 0 | 0 | |
| 0 | 1 | L | 0 | R | 0 | L | 0 | R | 1 | L | 1 | R | 1 | S | 1 | 0 | 0 | HOLD |

FIG. 12B

| PDI | PDQ | L11 | L11 | L12 | L12 | L13 | L13 | L21 | L21 | L22 | L22 | L23 | L23 | FD | dl1 | dl2 | clh | |
|---|---|---|---|---|---|---|---|---|---|---|---|---|---|---|---|---|---|---|
| 1 | 1 | R | 1 | 1 | 1 | R | 1 | L | 0 | R | R | 0 | L | 1 | S | 0 | 0 | 0 |
| 1 | 0 | R | 0 | L | 1 | R | 1 | L | 0 | R | R | 0 | L | 1 | S | 0 | 0 | 0 |
| 1 | 0 | R | 0 | L | 1 | R | 1 | L | 0 | R | R | 0 | L | 1 | S | 0 | 0 | 1 | AVOID FALSE DETECTION
| 0 | 0 | L | 0 | R | 0 | L | 1 | R | 0 | L | 1 | R | 1 | S | 0 | 0 | 1 |
| 1 | 0 | R | 0 | L | 1 | R | 1 | L | 0 | R | R | 0 | L | 0 | S | 0 | 0 | 0 |
| 0 | 0 | L | 1 | R | 1 | L | 1 | R | 0 | L | 0 | R | R | D | 0 | 0 | 0 |
| 0 | 0 | L | 1 | R | 1 | L | 1 | R | 0 | L | 0 | R | R | D | 0 | 0 | 0 |
| 0 | 1 | L | 1 | R | 1 | L | 1 | R | 1 | L | 0 | R | R | D | D | 0 | 1 | 0 |
| 0 | 0 | L | 1 | R | 1 | L | 1 | R | 0 | L | 0 | R | R | D | 0 | 0 | 0 |
| 0 | 1 | L | 1 | R | 1 | L | 1 | R | 1 | L | 0 | R | R | D | D | 0 | 1 | 0 |
| 0 | 1 | L | 1 | R | 1 | L | 1 | R | 1 | L | 0 | R | R | D | D | 0 | 1 | 0 |
| 1 | 1 | R | 1 | L | 1 | R | 1 | L | 0 | R | 0 | L | 0 | S | 0 | 1 | 0 | HOLD
| 0 | 1 | L | 1 | R | 1 | L | 1 | R | 1 | L | 0 | R | 0 | D | 0 | 1 | 0 |
| 1 | 1 | R | 1 | L | 1 | R | 1 | L | 0 | R | 0 | L | 1 | S | 0 | 1 | 0 |
| 1 | 1 | R | 1 | L | 1 | R | R | 1 | L | 0 | R | 0 | L | 1 | S | 0 | 1 | 0 |
| 1 | 0 | R | R | 0 | L | 1 | R | 1 | L | 0 | R | R | 0 | L | 1 | S | 0 | 1 | 0 |
| 1 | 1 | R | 1 | L | 1 | R | 1 | L | 0 | R | R | 0 | L | 1 | S | 0 | 0 | 0 |
| 1 | 0 | R | 0 | L | 1 | R | 1 | L | 0 | R | R | 0 | L | 1 | S | 0 | 0 | 0 |
| 1 | 0 | R | 0 | L | 1 | R | 1 | L | 0 | R | 0 | L | 1 | S | 0 | 0 | 1 | AVOID FALSE DETECTION
| 0 | 0 | L | 0 | R | 0 | L | 1 | R | 0 | L | 1 | R | 1 | S | 0 | 0 | 1 |
| 1 | 0 | R | 0 | L | 1 | R | 1 | L | 0 | R | 0 | L | 0 | S | 0 | 0 | 0 |
| 0 | 0 | L | 1 | R | 1 | L | 1 | R | 0 | L | 0 | R | 0 | D | 0 | 0 | 0 |
| 0 | 0 | L | 1 | R | 1 | L | 1 | R | 0 | L | 0 | R | 0 | D | 0 | 0 | 0 |
| 0 | 1 | L | 1 | R | 1 | L | 1 | R | 1 | L | 0 | R | R | 0 | D | 0 | 1 | 0 |
| 0 | 0 | L | 1 | R | 1 | L | 1 | R | 0 | L | 0 | R | R | 0 | D | 0 | 0 | 0 |
| 0 | 1 | L | 1 | R | 1 | L | 1 | R | 1 | L | 0 | R | R | 0 | D | 0 | 1 | 0 |
| 0 | 1 | L | 1 | R | 1 | L | 1 | R | 1 | L | 0 | R | R | 0 | D | 0 | 1 | 0 |
| 1 | 1 | R | 1 | L | 1 | R | 1 | L | 0 | R | 0 | L | 0 | S | 0 | 1 | 0 | HOLD
| 0 | 1 | L | 1 | R | 1 | L | 1 | R | 1 | L | 0 | R | 0 | D | 0 | 1 | 0 |
| 1 | 1 | R | 1 | L | 1 | R | 1 | L | 0 | R | 0 | L | 0 | S | 0 | 1 | 0 |
| 1 | 1 | R | 1 | L | 1 | R | 1 | L | 0 | R | 0 | L | 0 | S | 0 | 1 | 0 |
| 1 | 0 | R | 1 | L | 1 | R | 1 | L | 0 | R | 0 | L | 0 | S | 0 | 0 | 0 |

FIG. 14
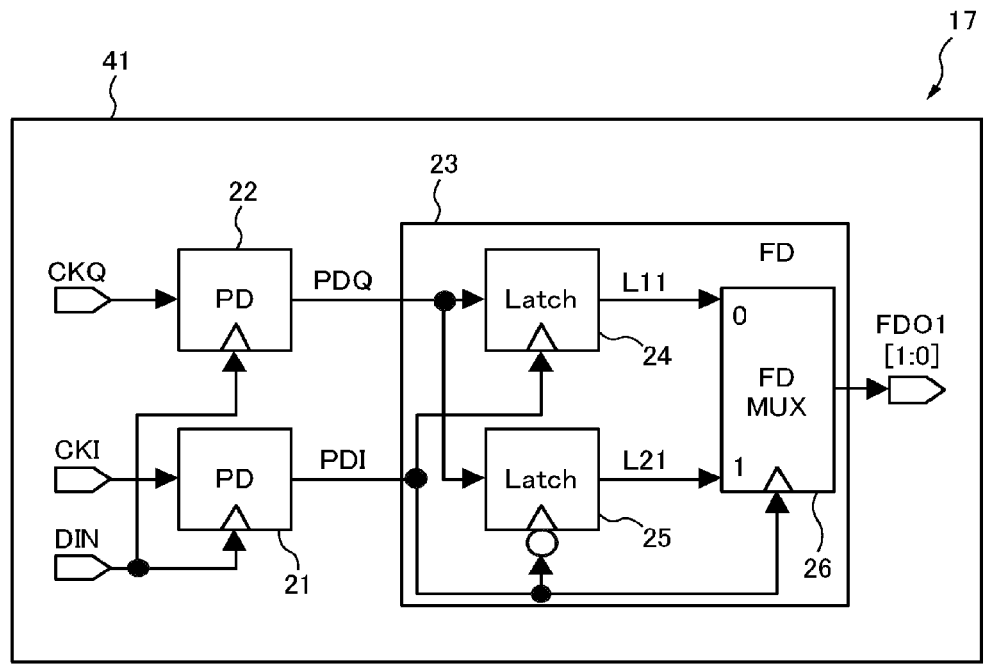
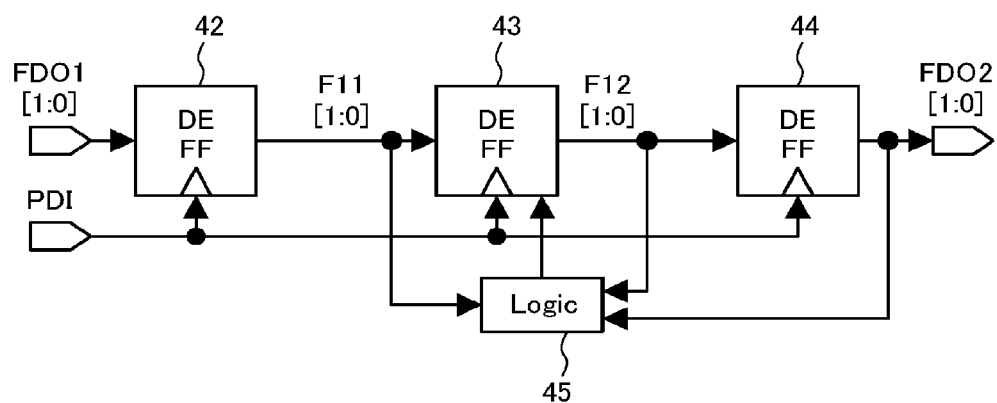

CLOCK DATA RECOVERY CIRCUIT, ELECTRONIC DEVICE, AND CLOCK DATA RECOVERY METHOD

CROSS-REFERENCE TO RELATED APPLICATION

This application is based upon and claims the benefit of priority of the prior Japanese Patent Application No. 2016-160800, filed on Aug. 18, 2016, the entire contents of which are incorporated herein by reference.

FIELD

The embodiments discussed herein relate to a clock data recovery (CDR) circuit, an electronic device having a clock data recovery circuit mounted therein, and a clock data recovery method.

BACKGROUND

Along with improvements in the performance of information processing apparatuses such as communication backbone-oriented devices and servers, there is a desire to increase the data rates for signal transmission and reception inside and outside of the devices. For example, a greater increase in bit rate speeds is desired in the fields of high-speed input/output (I/O) and optical communications for the transmission and reception of signals within integrated circuit chips and between chips (or within devices and between devices).

A receiving circuit is expected to evaluate transferred data at a suitable timing and perform clock and data recovery (CDR). CDR is achieved by detecting the phase difference and the frequency difference between input data and a receiving (sampling) clock and then adjusting the phase of the sampling clock based on the detected information. A CDR circuit is known that does not use a reference clock even in the receiving circuit and carries out re-timing with a clock generated from the input data and then outputs data with reduced jitter.

The use of a phase detector (PD) for detecting the phase difference between the input data and a clock in a CDR circuit is well known (see, for example, Japanese Laid-open Patent Publication No. 2005-252723). The phase and the frequency of the input data and the clock are controlled so as to be matched based on the phase difference detected by the phase detector. A frequency detector (FD) that detects the frequency difference between the input data and the clock from the rotating direction of the phase is well known (see, for example, non-patent document: POTTBACKER, Ansgar et al., "A Si Bipolar Phase and Frequency Detector IC for Clock Extraction Up to 8 Gb/s", IEEE Journal of Solid-State Circuits, Vol. 27, No. 12, pp. 1747-1751, December 1992).

SUMMARY

According to an aspect of the invention, a clock data recovery circuit includes an oscillator that outputs a first clock of which a frequency is variable and a second clock having the same frequency and a different phase of the first clock, and a feedback circuit that controls the oscillator so as to synchronize input data and the first clock in response to a phase difference and a frequency difference between the input data and the first clock, the feedback circuit including a controller that controls the oscillator in response to a frequency difference signal which indicates a change command to change the frequency of the first clock and a phase difference signal which indicates a change command to change the phase of the first clock, a first difference detector that generates a first difference signal which indicates the phase difference between the input data and the first clock, a second difference detector that generates a second difference signal which indicates the phase difference between the input data and the second clock, and a frequency detector that outputs the frequency difference signal which indicates any one of a rising state in which the frequency of the first clock is rising, a falling state in which the frequency of the first clock is falling, and a standby state in which the frequency of the first clock is not changed, based on the first difference signal and the second difference signal, the frequency detector including a state detector that detects one of the rising state or the falling state when the phase of the first clock is a first phase, and a state holder that holds a state detected in the first phase and outputs the frequency difference signal indicating the held state at a second phase that is different from the first phase.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5A illustrates the operation of the frequency detector when the frequency of a first clock is lower than the frequency of the input data, FIG. 5B illustrates the operation of the frequency detector when the frequency of the first clock is higher than the frequency of the input data, FIG. 5C is a diagram for explaining the state in FIG. 5A, and FIG. 5D is a diagram for explaining the state in FIG. 5B;

FIG. 6A illustrates a malfunction of the frequency detector when the frequency of a first clock is lower than the frequency of the input data, FIG. 6B illustrates a malfunction of the frequency detector when the frequency of the first clock is higher than the frequency of the input data, and FIG. 6C is a diagram for explaining the malfunction of the state illustrated in FIG. 6A;

FIG. 7A illustrates the operation when the frequency detector controls the phase of the first clock correctly, FIG. 7B illustrates the operation when the frequency detector controls the phase of the first clock incorrectly, and FIG. 7C is a diagram for explaining the state illustrated in FIG. 7A, and FIG. 7D is a diagram for explaining the state illustrated in FIG. 7B;

FIG. 11A illustrates operations of the phase frequency detector illustrated in FIG. 9 when the frequency of the first clock is lower than the frequency of the input data and jitter does not occur, FIG. 11B illustrates operations of the phase frequency detector illustrated in FIG. 9 when the frequency of the first clock is higher than the frequency of the input data and jitter does not occur;

FIG. 12A illustrates operations of the phase frequency detector illustrated in FIG. 9 when the frequency of the first clock is lower than the frequency of the input data and jitter occurs, FIG. 12B illustrates operations of the phase frequency detector illustrated in FIG. 9 when the frequency of the first clock is higher than the frequency of the input data and jitter occurs;

FIG. 14 is an internal circuit block diagram of the phase frequency detector illustrated in FIG. 13;

DESCRIPTION OF EMBODIMENTS

When a difference in frequencies between input data and a clock is detected from the rotating direction of the phase, there is a concern that a false detection of the difference in frequencies between the input data and the clock may occur. According to a first embodiment, a clock data recovery circuit is achieved in which a false detection of the difference in frequencies between the input data and the clock due to jitter is not a concern.

A related clock data recovery (CDR) circuit will be discussed before the discussion of the embodiments.

Figure 1:
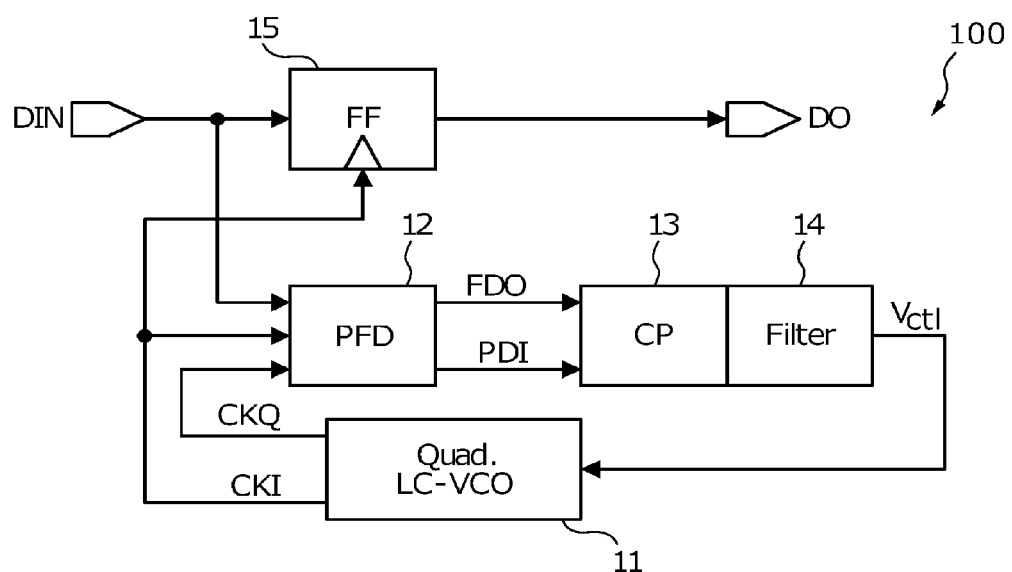
FIG. 1 illustrates a clock data recovery circuit that uses the phase frequency detector described in non-patent document.
Figure 2A:
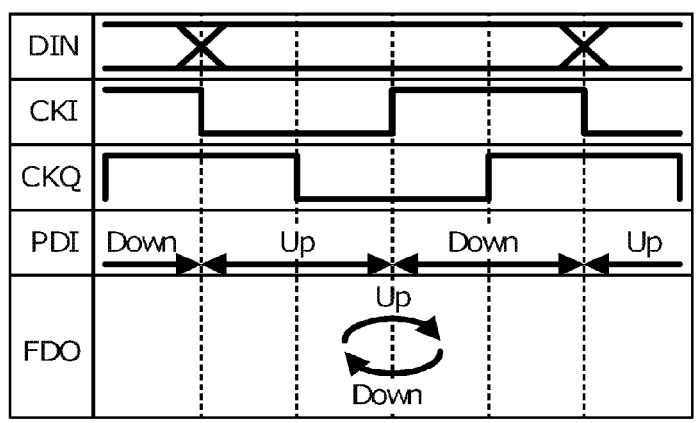
FIG. 2A is a timing chart illustrating operations of the clock data recovery circuit illustrated in FIG. 1.
Figure 2B:
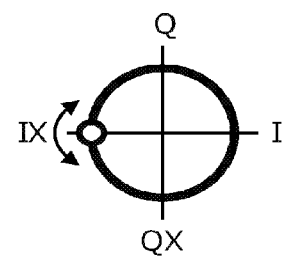
FIG. 2B illustrates a phase relation when the clock data recovery circuit illustrated in FIG. 1 is in a synchronization state.

FIG. 1 illustrates a CDR circuit that uses the phase frequency detector (PFD) described in non-patent document. FIG. 2A is a timing chart illustrating operations of the clock data recovery circuit illustrated in FIG. 1, and FIG. 2B illustrates a phase relation when the clock data recovery circuit illustrated in FIG. 1 is in a synchronization state.

A CDR circuit 100 has a voltage control oscillator (VCO) 11, a phase frequency detector (PFD) 12, a charge pump (CP) 13, a loop filter 14, and a data output flip-flop 15. While the VCO 11 is not limited to voltage control if the frequency can be varied, the VCOs have a wide variety of uses and therefore an example of the use of the following VCO will be explained. The VCO 11 adjusts the frequencies and the phases of a first clock CKI and a second clock CKQ in response to a control voltage $V_{ctl}$ input from a loop filter. In a synchronization state, the VCO 11 outputs the first clock CKI and the second clock CKQ that has the same frequency as the frequency of the first clock CKI and has a phase that is different by $\pi/2$ from the first clock CKI.

The PFD 12 detects the phase difference between input data DIN and the first clock CKI from the phase differences between the input data DIN, the first clock CKI, and the second clock CKQ. The PFD 12 outputs a frequency difference signal FDO which indicates a change command to change the frequency of the first clock CKI based on the detected phase difference.

The PFD 12 also outputs a phase difference signal PDI which indicates the change command to change the phase of the first clock CKI based on a signal value corresponding to the first clock CKI at the changing edge of the input data DIN. The PFD 12 outputs the phase difference signal PDI which indicates the advancement of the phase of the first clock CKI when the signal value corresponding to the first clock CKI is "0" at the changing edge of the input data DIN. The PFD 12 outputs the phase difference signal PDI which indicates the delay of the phase of the first clock CKI when the signal value corresponding to the first clock CKI is "1" at the changing edge of the input data DIN. The PFD 12 controls the phase of the first clock CKI so that the changing edge of the input data DIN matches the falling edge of the first clock CKI. The changing edge of the input data DIN matches the falling edge of the first clock CKI whereby the phase of the rising edge of the first clock CKI is controlled to become the phase in the center between the changing edges of the input data DIN.

The CP 13 and the loop filter 14 generate the control voltage $V_{ctl}$ and output the generated control voltage $V_{ctl}$ to the VCO 11 in response to the frequency difference signal FDO and the phase difference signal PDI input by the PFD 12. The CP 13 and the loop filter 14 function as control units for controlling the VCO 11 in response to the frequency difference signal FDO, which indicates the change command to change the frequency of the first clock CKI, and the phase difference signal PDI, which indicates the change command to change the phase of the first clock CKI.

The data output flip-flop 15 latches the input data DIN at the rising edge of the first clock CKI and outputs the latched data as output data DO.

Figure 3:
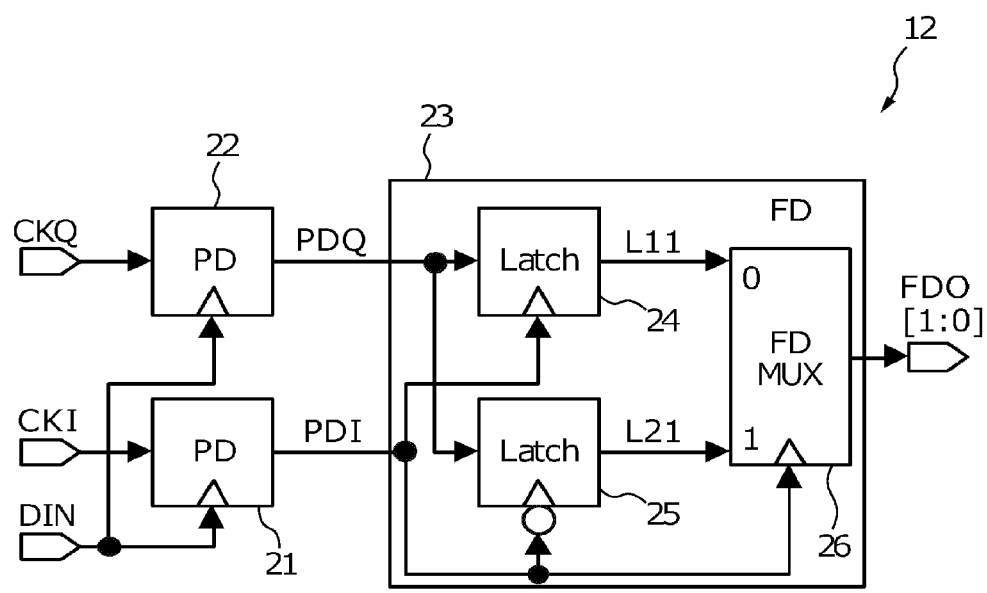
FIG. 3 is an internal circuit block diagram of the phase frequency detector illustrated in FIG. 1.
Figure 4A:
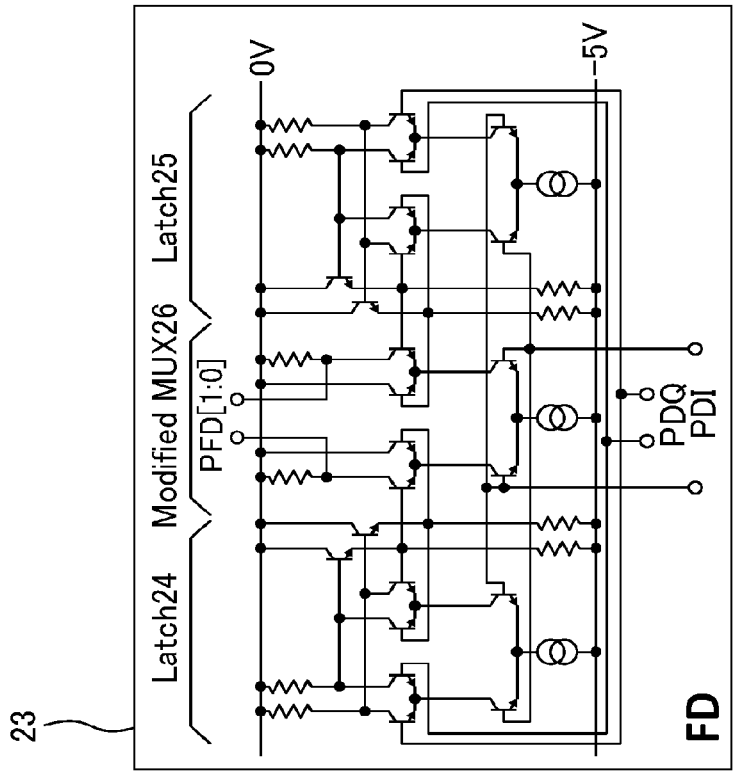
FIG. 4A is an internal circuit block diagram of the first phase detector illustrated in FIG. 3.
Figure 4B:
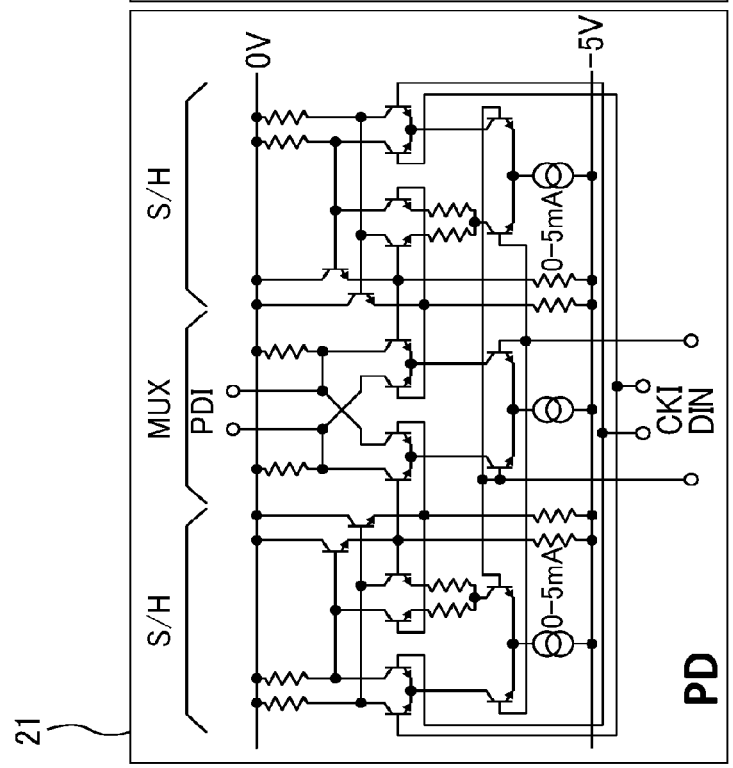
FIG. 4B illustrates an internal circuit block diagram of the frequency detector illustrated in FIG. 3.

FIG. 3 is an internal circuit block diagram of the PFD 12, FIG. 4A is an internal circuit block diagram of the first phase detector illustrated in FIG. 3, and FIG. 4B illustrates an internal circuit block diagram of the frequency detector illustrated in FIG. 3. FIG. 4A corresponds to FIG. 3 in non-patent document and FIG. 4B corresponds to FIG. 4 in non-patent document.

The PFD 12 has a first phase detector 21, a second phase detector 22, and a frequency detector (FD) 23. The first phase detector 21 and the second phase detector 22 have the same circuit configuration.

The first phase detector 21 outputs a first phase signal PDI which indicates the phase difference between the input data DIN and the first clock CKI. The first phase detector 21 outputs the first phase signal PDI indicating the signal value "1" when the phase of the changing edge of the input data DIN is delayed in comparison to the phase of the rising edge of the first clock CKI. The first phase detector 21 also outputs the first phase signal PDI indicating the signal value "0" when the phase of the changing edge of the input data DIN is advanced in comparison to the phase of the rising edge of the first clock CKI.

The second phase detector 22 outputs a second phase signal PDQ which indicates the phase difference between the input data DIN and the second clock CKQ. The second phase detector 22 outputs the second phase signal PDQ indicating the signal value "1" when the phase of the changing edge of the input data DIN is delayed in comparison to the phase of the rising edge of the second clock CKQ. The second phase detector 22 outputs the second phase signal PDQ indicating the signal value "0" when the phase of the changing edge of the input data DIN is advanced in comparison to the phase of the rising edge of the second clock CKQ.

The FD 23 has a first phase latch circuit 24, a second phase latch circuit 25, and a frequency detection multiplexer 26.

The first phase latch circuit 24 outputs the second phase signal PDQ as an eleventh latch signal L11 when the signal value corresponding to the first phase signal PDI is "0". The first phase latch circuit 24 latches the second phase signal PDQ at the rising edge of the first phase signal PDI and outputs the latched second phase signal PDQ as the eleventh latch signal L11 when the signal value corresponding to the first phase signal PDI is "1".

The second phase latch circuit 25 outputs the second phase signal PDQ as a twenty-first latch signal L21 when the signal value corresponding to the first phase signal PDI is "1". The second phase latch circuit 25 latches the second phase signal PDQ at the falling edge of the first phase signal PDI and outputs the latched second phase signal PDQ as the twenty-first latch signal L21 when the signal value corresponding to the first phase signal PDI is "0".

The frequency detection multiplexer 26 outputs the eleventh latch signal L11 and the twenty-first latch signal L21 as the 2-bit frequency difference signal FDO when the signal value corresponding to the first phase signal PDI is "0". The frequency detection multiplexer 26 latches the eleventh latch signal L11 and the twenty-first latch signal L21 at the rising edge of the first phase signal PDI. The frequency detection multiplexer 26 outputs the eleventh latch signal L11 and the twenty-first latch signal L21 as the frequency difference signal FDO when the signal value corresponding to the first phase signal PDI is "1".

The FD 23 outputs a signal value "10" corresponding to the frequency difference signal FDO indicating a rising state Up when the signal value corresponding to the second phase signal PDQ is "0" and the signal value corresponding to the first phase signal PDI changes from "1" to "0".

The FD 23 outputs a signal value "01" corresponding to the frequency difference signal FDO indicating a falling state Down when the signal value corresponding to the second phase signal PDQ is "0" and the signal value corresponding to the first phase signal PDI changes from "0" to "1".

The FD 23 outputs the signal value "11" corresponding to the frequency difference signal FDO which indicates a standby state Stay at the rising edge of the first phase signal PDI when the signal value corresponding to a twelfth latch signal L12 and a twenty-second latch signal L22 is "1".

FIG. 5A illustrates the operation of the PFD 12 when the frequency of the first clock CKI is lower than the frequency of the input data DIN, and FIG. 5B illustrates the operation of the PFD 12 when the frequency of the first clock CKI is higher than the frequency of the input data DIN. FIG. 5C is a diagram for explaining the state in FIG. 5A, and FIG. 5D is a diagram for explaining the state in FIG. 5B. In FIG. 5A and FIG. 5B, "R" signifies a read mode, "L" signifies a latch mode, "Stay" signifies a standby state, "Up" signifies a rising state, and "Down" signifies a falling state.

When the frequency of the first clock CKI is lower than the frequency of the input data DIN, the signal values corresponding to the first phase signal PDI and the second phase signal PDQ change in the following order: (PDI/PDQ) =(1/1)→(1/0)→(0/0)→(0/1). That is, when the frequency of the first clock CKI is lower than the frequency of the input data DIN, the signal values corresponding to the first phase signal PDI and the second phase signal PDQ rotate counterclockwise in the phase domain as indicated in FIG. 5C. The PFD 12 detects the presence of the rising state Up, in which the frequency of the first clock CKI is rising, in response to the change of the signal value corresponding to the first phase signal PDI from "1" to "0" when the signal value corresponding to the second phase signal PDQ is "0". When the PFD 12 detects the presence of the rising state Up, the PFD 12 outputs, to the CP 13, the frequency difference signal FDO which indicates the rising state Up over the period while the signal value corresponding to the first phase signal PDI is "0". The frequency difference signal FDO which indicates the rising state Up is a 2-bit signal and corresponds to the signal value "10". The time period in which the PFD 12 outputs the frequency difference signal FDO indicating the rising state Up is the time period in which the phase of the first clock CKI changes from phase I to phase IX in FIG. 5C. When the phase of the first clock CKI attains the phase IX and the signal value corresponding to the first phase signal PDI changes to "1", the PFD 12 detects the standby state Stay in which the frequency of the first clock CKI is not changed. When the PFD 12 detects the standby state Stay, the PFD 12 outputs the frequency difference signal FDO which indicates the standby state Stay. The frequency difference signal FDO which indicates the standby state Stay is a 2-bit signal and corresponds to the signal value "11".

When the frequency of the first clock CKI is higher than the frequency of the input data DIN, the signal values corresponding to the first phase signal PDI and the second phase signal PDQ change in the following order: (PDI/PDQ) =1/1→0/1→0/0→1/0. That is, when the frequency of the first clock CKI is higher than the frequency of the input data DIN, the signal values corresponding to the first phase signal PDI and the second phase signal PDQ rotate clockwise in the phase domain as indicated in FIG. 5D. The PFD 12 detects the presence of the falling state Down, in which the frequency of the first clock CKI is falling, in response to the change of the signal value corresponding to the first phase signal PDI from "0" to "1" when the signal value corresponding to the second phase signal PDQ is "0". When the PFD 12 detects the presence of the falling state Down, the PFD 12 outputs, to the CP 13, the frequency difference signal FDO which indicates the falling state Down over the period while the signal value corresponding to the first phase signal PDI is "1". The frequency difference signal FDO which indicates the falling state Down is a 2-bit signal and corresponds to the signal value "01". The time period in which the PFD 12 outputs the frequency difference signal FDO indicating the falling state Down is the time period in which the phase of the first clock CKI changes from phase I to phase IX in FIG. 5D. When the phase of the first clock CKI attains the phase IX and the signal value corresponding to the first phase signal PDI changes to "0", the PFD 12 detects the standby state Stay in which the frequency of the first clock CKI is not changed. When the PFD 12 detects the standby state Stay, the PFD 12 outputs the frequency difference signal FDO which indicates the standby state Stay.

The PFD 12 detects that the frequency of the first clock CKI is in either of the rising state Up or the falling state Down while the phase of the first clock CKI is between the phase I and the phase IX. The PFD 12 outputs the frequency difference signal FDO which indicates either of the rising state Up or the falling state Down in response to the detected state during the period while the phase of the first clock CKI is between the phase I and the phase IX. The PFD 12 detects the standby state Stay and outputs the frequency difference signal FDO which indicates the standby state Stay while the phase of the first clock CKI is between the phase IX and the phase I.

However, there is a concern that the PFD 12 is not able to accurately detect whether the state is the rising state Up or the falling state Down due to the effect of jitter of the input data DIN.

FIG. 6A illustrates a malfunction of the PFD 12 when the frequency of the first clock CKI is lower than the frequency of the input data DIN, and FIG. 6B illustrates a malfunction of the PFD 12 when the frequency of the first clock CKI is higher than the frequency of the input data DIN. FIG. 6C is a diagram for explaining the malfunction during the state depicted in FIG. 6A.

As illustrated in FIG. 6A, when the signal value corresponding to the second phase signal PDQ is "0", the PFD 12 outputs the frequency difference signal FDO which indicates the falling state Down when the signal value corresponding to the first phase signal PDI changes from "0" to "1" due to the effect of jitter. As illustrated in FIG. 6B, when the signal value corresponding to the second phase signal PDQ is "0", the PFD 12 outputs the frequency difference signal FDO which indicates the rising state Up when the signal value corresponding to the first phase signal PDI changes from "1" to "0" due to the effect of jitter. Because the PFD 12 is not able to correctly detect the rising state Up or the falling state Down due to the jitter of the input data DIN and because the probability that the PFD 12 will output the frequency difference signal FDO which indicates the correct state is low, a signal that is the opposite of the desired signal may be output and the frequency pull-in characteristics may deteriorate.

There is also a concern that the PFD 12 would not be able to control the phase of the first clock CKI so that the changing edge of the input data DIN matches the falling edge of the first clock CKI.

FIG. 7A illustrates the operation when the PFD 12 controls the phase of the first clock CKI correctly, and FIG. 7B illustrates operations when the PFD 12 controls the phase of the first clock CKI incorrectly. FIG. 7C is a diagram for explaining the state in FIG. 7A, and FIG. 7D is a diagram for explaining the state in FIG. 7B. In FIG. 7A and FIG. 7B, "R" signifies a read mode, "L" signifies a latch mode, "Stay" signifies a standby state, "Up" signifies a rising state, and "Down" signifies a falling state.

When the PFD 12 determines that the frequency of the first clock CKI matches the frequency of the input data DIN, the PFD 12 detects the standby state Stay and outputs the second phase signal PDQ indicating the signal value "1". The PFD 12 changes the signal value of the first phase signal PDI between "0" and "1" while the second phase signal PDQ indicating the signal value of "1" is output, whereby the PFD 12 controls the phase of the first clock CKI to be the phase IX as illustrated in FIG. 7C.

However, when the frequency of the input data DIN approximately matches the frequency of the first clock CKI and the phase change of the first clock CKI is delayed, there is a concern that the PFD 12 may incorrectly control the phase of the first clock CKI due to the effect of the jitter. When the signal value corresponding to the first phase signal PDI is alternately changed between "0" and "1" while the signal value of "0" corresponding to the second signal is being output, the phase of the first clock CKI is controlled to match the phase I. The phase I is the phase in which the rising edge of the first clock CKI matches the changing edge of the input data DIN and is a phase shifted by $\pi$ from the desired phase.

Figure 8A:
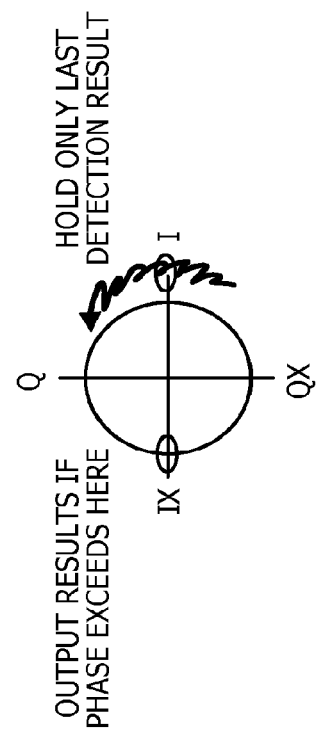
FIG. 8A is a first diagram for explaining the operations of a phase frequency detector according to an embodiment.
Figure 8B:
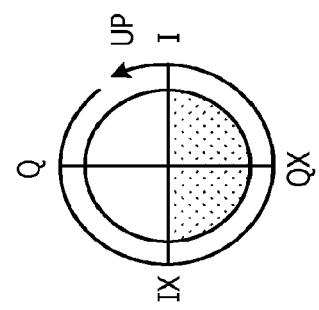
FIG. 8B is a second diagram for explaining the operations of the phase frequency detector according to the embodiment.
Figure 8C:
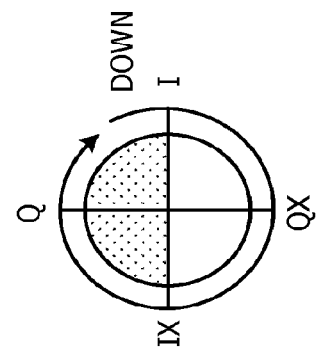
FIG. 8C is a third diagram for explaining the operations of the phase frequency detector according to the embodiment.

FIG. 8A is a first diagram for explaining the operations of the PFD according to the embodiments, FIG. 8B is a second diagram for explaining the operations of the PFD according to the embodiments, and FIG. 8C is a third diagram for explaining the operations of the PFD according to the embodiments.

When there is a malfunction, the PFD 12 consecutively detects the rising state Up and the falling state Down without the standby state Stay interposed therein as illustrated in FIG. 6A and FIG. 6B. Accordingly, the PFD according to the embodiments determines that there is a malfunction when the PFD consecutively detects the rising state Up and the falling state Down. When the PFD according to the embodiments detects the rising state Up or the falling state Down that has changed without the standby state Stay interposed therein, the PFD according to the embodiments outputs the frequency difference signal FDO which indicates the standby state Stay instead of the rising state Up or the falling state Down. Next, the state in which the rising state Up and the falling state Down are consecutively detected is the correct state before the rising state Up and the falling state Down are consecutively detected. The PFD according to the embodiments holds the last state of the state in which the rising state Up and the falling state Down consecutively change, namely, the correct state.

The PFD according to the embodiments detects and holds the state of the frequency of the first clock CKI while the phase of the first clock CKI changes from the phase I to the phase IX, and outputs the frequency difference signal FDO indicating the standby state Stay. The PFD according to the embodiments outputs the frequency difference signal FDO indicating the held state while the phase of the first clock CKI changes from the phase IX to the phase I. When the frequency of the first clock CKI is lower than the frequency of the input data DIN, the PFD according to the embodiments outputs the frequency difference signal FDO indicating the rising state Up while the phase is between the phase IX and the phase I as illustrated in FIG. 8B. When the frequency of the first clock CKI is higher than the frequency of the input data DIN, the PFD according to the embodiments outputs the frequency difference signal FDO indicating the falling state Down while the phase is between the phase IX and the phase I as illustrated in FIG. 8C.

When the PFD according to the embodiments detects the rising state Up or the falling state Down that has changed without the standby state Stay interposed therein, the PFD according to the embodiments outputs the frequency difference signal FDO indicating the standby state Stay and therefore there is no concern that the PFD according to the embodiments outputs the frequency difference signal FDO which indicates the incorrect state.

The PFD according to the embodiments holds the state detected in the phase I, whereby the PFD according to the embodiments is able to output the frequency difference signal FDO indicating the held state while the phase changes from the phase IX to the phase I.

Figure 9:
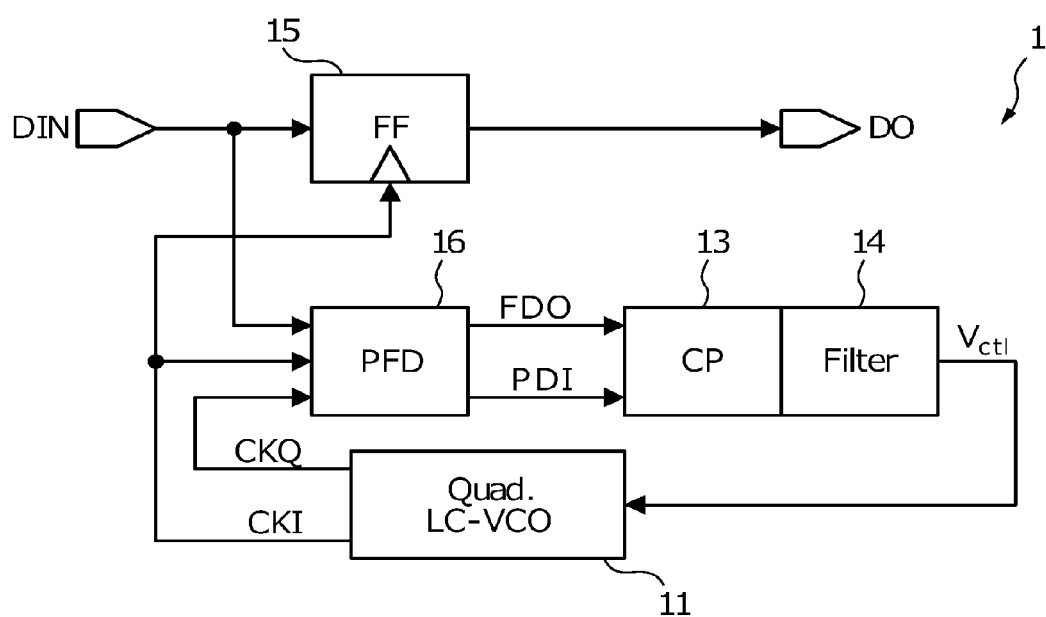
FIG. 9 is a circuit block diagram of a clock data recovery circuit according to a first embodiment.

FIG. 9 is a circuit block diagram of a CDR circuit according to a first embodiment.

A CDR circuit 1 differs from the CDR 100 in that a PFD 16 is disposed in place of the PFD 12. The functions and configurations of the constituent elements of the CDR circuit 1 other than the PFD 16 are the same as the functions and configurations of the constituent elements of the CDR circuit 100 attributed with the same reference numerals and thus detailed explanations will be omitted.

Figure 10:
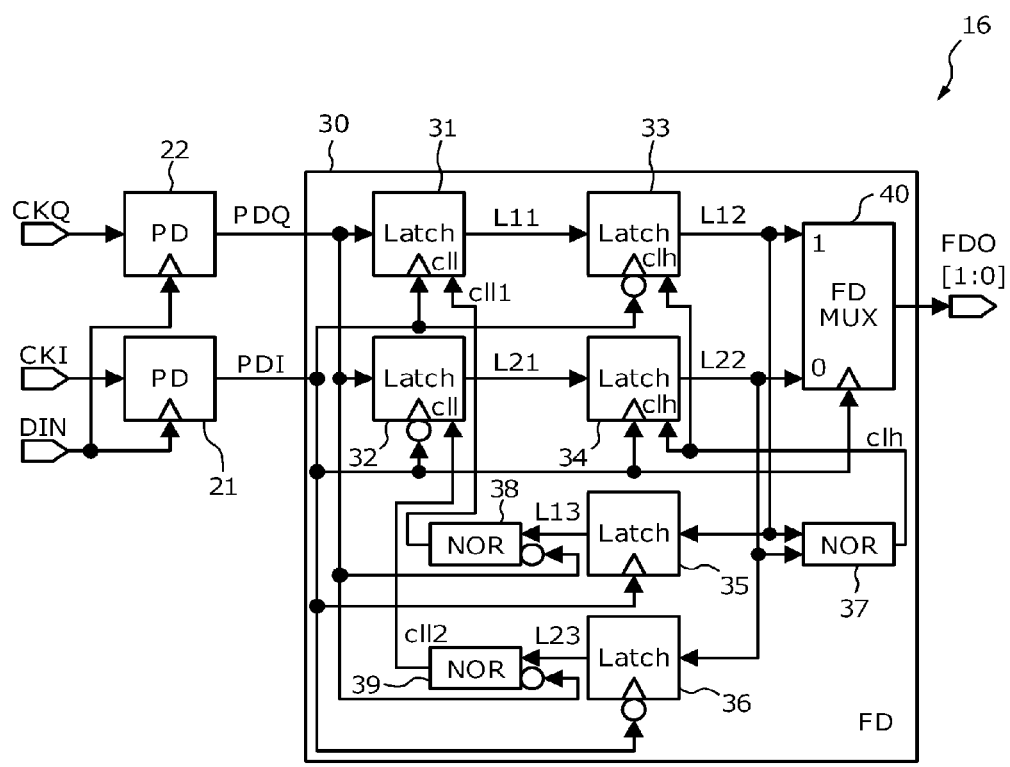
FIG. 10 is an internal circuit block diagram of the phase frequency detector illustrated in FIG. 9.

FIG. 10 is an internal circuit block diagram of the PFD 16.

The PFD 16 achieves the operations discussed with regard to FIG. 8 inside the phase frequency detector. The PFD 16 differs from the PFD 12 in that a FD 30 is disposed in place of the FD 23. The functions and configurations of the constituent elements of the PFD 16 other than the FD 30 are the same as the functions and configurations of the constituent elements of the PFD 12 attributed with the same reference numerals and thus detailed explanations will be omitted.

The FD 30 has first to sixth phase latch circuits 31 to 36, first to third NOR circuits 37 to 39, and a frequency detection multiplexer 40.

The first phase latch circuit 31 outputs the second phase signal PDQ as the eleventh latch signal L11 when the signal value corresponding to the first phase signal PDI is "0". The first phase latch circuit 31 latches the second phase signal PDQ at the rising edge of the first phase signal PDI and outputs the latched second phase signal PDQ as the eleventh latch signal L11 when the signal value corresponding to the first phase signal PDI is "1". The first phase latch circuit 31 outputs the eleventh latch signal L11 which indicates the signal value "0" when the signal value corresponding to a first clear low signal cll1 is "1".

The second phase latch circuit 32 outputs the second phase signal PDQ as the twenty-first latch signal L21 when the signal value corresponding to the first phase signal PDI is "1". The second phase latch circuit 32 latches the second phase signal PDQ at the falling edge of the first phase signal PDI and outputs the latched second phase signal PDQ as the twenty-first latch signal L21 when the signal value corresponding to the first phase signal PDI is "0". The second phase latch circuit 32 outputs the twenty-first latch signal L21 indicating the signal value "0" when the signal value corresponding to a second clear low signal cll2 is "1".

The first phase latch circuit 31 and the second phase latch circuit 32 function as state detectors for detecting whether the state is the rising state Up or the falling state Down when the phase of the first clock CKI is the phase I.

The third phase latch circuit 33 outputs the eleventh latch signal L11 as a twelfth latch signal L12 when the signal value corresponding to the first phase signal PDI is "1". The third phase latch circuit 33 latches the eleventh latch signal L11 at the falling edge of the first phase signal PDI and outputs the latched eleventh latch signal L11 as the twelfth latch signal L12 when the signal value corresponding to the first phase signal PDI is "0". The third phase latch circuit 33 outputs the twelfth latch signal L12 indicating the signal value "1" when the signal value corresponding to a clear high signal clh is "1".

The fourth phase latch circuit 34 outputs the twenty-first latch signal L21 as the twenty-second latch signal L22 when the signal value corresponding to the first phase signal PDI is "0". The fourth phase latch circuit 34 latches the twenty-first latch signal L21 at the rising edge of the first phase signal PDI and outputs the latched twenty-first latch signal L21 as the twenty-second latch signal L22 when the signal value corresponding to the first phase signal PDI is "1". The fourth phase latch circuit 34 outputs the twenty-second latch signal L22 indicating the signal value "1" when the signal value corresponding to the clear high signal clh is "1".

The fifth phase latch circuit 35 outputs the twelfth latch signal L12 as a thirteenth latch signal L13 when the signal value corresponding to the first phase signal PDI is "0". The fifth phase latch circuit 34 latches the twelfth latch signal L12 at the rising edge of the first phase signal PDI and outputs the latched twelfth latch signal L12 as the thirteenth latch signal L13 when the signal value corresponding to the first phase signal PDI is "1".

The sixth phase latch circuit 36 outputs the twenty-second latch signal L22 as a twenty-third latch signal L23 when the signal value corresponding to the first phase signal PDI is "1". The sixth phase latch circuit 36 latches the twenty-second latch signal L22 at the falling edge of the first phase signal PDI and outputs the latched twenty-second latch signal L22 as the twenty-third latch signal L23 when the signal value corresponding to the first phase signal PDI is "0".

The first NOR circuit 37 outputs the clear high signal clh which indicates the signal value "1" to the third phase latch circuit 33 and the fourth phase latch circuit 34 when the signal values corresponding to both the twelfth latch signal L12 and the twenty-second latch signal L22 are "0". The first NOR circuit 37 outputs the clear high signal clh which indicates the signal value "0" to the third phase latch circuit 33 and the fourth phase latch circuit 34 when the signal value corresponding to at least one of the twelfth latch signal L12 and the twenty-second latch signal L22 is "1".

The second NOR circuit 38 outputs the first clear low signal cll1 indicating the signal value "1" to the first phase latch circuit 31 when the signal values corresponding to both the inversion signal of the second phase signal PDQ and the thirteenth latch signal L13 is "0". The second NOR circuit 38 outputs the first clear low signal cll1 indicating the signal value "0" to the first phase latch circuit 31 when the signal value corresponding to at least one of the inversion signal of the second phase signal PDQ and the thirteenth latch signal L13 is "1".

The third NOR circuit 39 outputs the second clear low signal cll2 indicating the signal value "1" to the second phase latch circuit 32 when the signal values corresponding to both the inversion signal of the second phase signal PDQ and the twenty-third latch signal L23 are "0". The third NOR circuit 39 outputs the second clear low signal cll2 indicating the signal value "0" to the second phase latch circuit 32 when the signal value corresponding to at least one of the inversion signal of the second phase signal PDQ and the twenty-third latch signal L23 is "1".

The frequency detection multiplexer 40 has the same configuration as the frequency detection multiplexer 26. The frequency detection multiplexer 40 outputs the twelfth latch signal L12 and the twenty-second latch signal L22 as the 2-bit frequency difference signal FDO when the signal value corresponding to the first phase signal PDI is "0". The frequency detection multiplexer 40 latches the twelfth latch signal L12 and the twenty-second latch signal L22 at the rising edge of the first phase signal PDI. The frequency detection multiplexer 40 outputs the latched twelfth latch signal L12 and the twenty-second latch signal L22 as the frequency difference signal FDO when the signal value corresponding to the first phase signal PDI is "1".

The third phase latch circuit 33 to the frequency detection multiplexer 40 all function as state holders that hold the state detected in the phase IX and output a frequency difference signal indicating the held state in the phase IX. Specifically, the third to fourth phase latch circuits 33 to 34 function as holders for holding the state detected in the phase I. The first NOR circuit 37 functions as a holding state changing circuit for changing the state held by the holders to the standby state Stay when the state detector detects that the state has changed between the rising state Up and the falling state Down without the standby state Stay being interposed therein. The fifth to sixth phase latch circuits 35 to 36 and the second NOR circuit 38 and the third NOR circuit 39 function as detected state changing circuits for changing the state to the state detected before the change when it is detected that the state has changed between the rising state Up and the falling state Down.

The state holders output the frequency difference signal which indicates the standby state Stay while the phase of the first clock CKI changes from the phase I to the phase IX. The state holders output the frequency difference signals which indicate the states held while the phase of the first clock CKI changes from the phase IX to the phase I, that is, which indicate either the rising state Up or the falling state Down. The state holders continue to output the frequency difference signal FDO which indicates the standby state Stay when the state detectors detect that the state has changed between the rising state Up and the falling state Down without the standby state Stay interposed therein while the frequency difference signal indicating the standby state Stay is output. However, the state holders output the frequency difference signal FDO which indicates the standby state Stay when the state detectors detect that the state has changed between the rising state Up and the falling state Down without the standby state Stay interposed therein while the frequency difference signal indicating the held state is output.

Figure 11A:
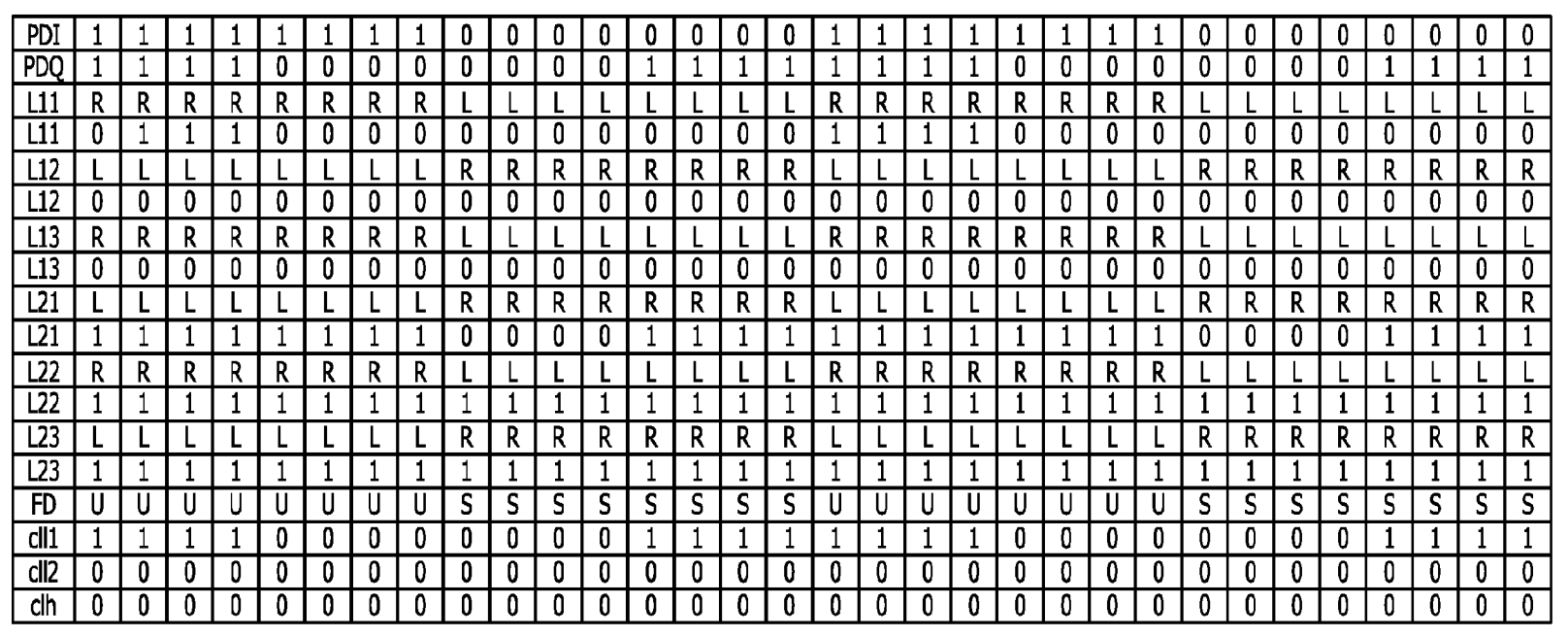
Figure 11B:
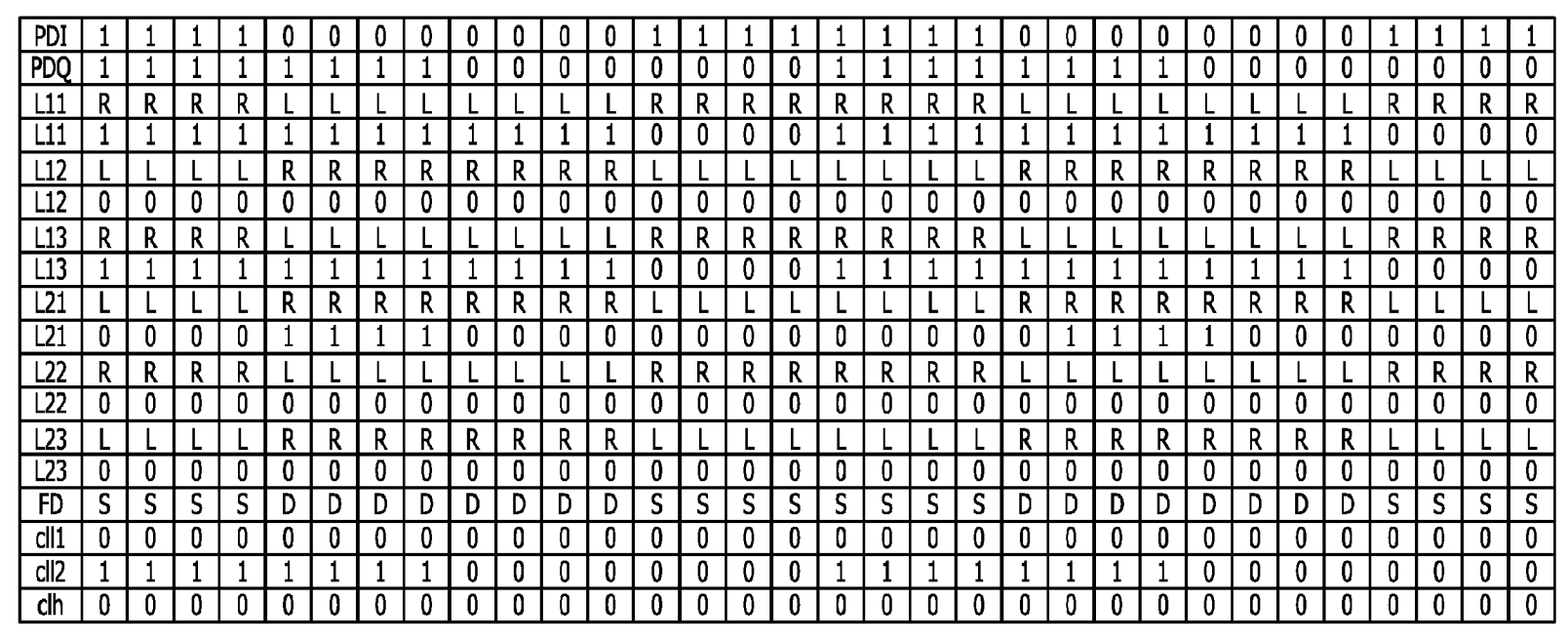

FIG. 11A illustrates operations of the PFD 16 when the frequency of the first clock CKI is lower than the frequency of the input data DIN and jitter does not occur. FIG. 11B illustrates operations of the PFD 16 when the frequency of the first clock CKI is higher than the frequency of the input data DIN and jitter does not occur. In FIG. 11A and FIG. 11B, "R" signifies a read mode, "L" signifies a latch mode, "Stay" signifies a standby state, "Up" signifies a rising state, and "Down" signifies a falling state.

When the frequency of the first clock CKI is lower than the frequency of the input data DIN, the signal values corresponding to the first phase signal PDI and the second phase signal PDQ change in the following order: (PDI/PDQ) =(1/1)→(1/0)→(0/0)→(0/1). The PFD 16 detects the presence of the rising state Up, in which the frequency of the first clock CKI is rising, in response to the change of the signal value corresponding to the first phase signal PDI from "1" to "0" when the signal value corresponding to the second phase signal PDQ is "0", and the PFD 16 holds the rising state Up. When the signal value corresponding to the first phase signal PDI changes to "0", the PFD 16 detects the standby state Stay in which the frequency of the first clock CKI is not changed. The PFD 16 outputs, to the CP 13, the frequency difference signal FDO which indicates the rising state Up over the period while the signal value corresponding to the first phase signal PDI is "1". The frequency difference signal FDO which indicates the rising state Up is a 2-bit signal and corresponds to the signal value "10". The time period in which the PFD 16 outputs the frequency difference signal FDO indicating the rising state Up is the time period in which the phase of the first clock CKI changes from phase IX to phase I in FIG. 8B. The PFD 16 outputs the frequency difference signal FDO which indicates the standby state Stay when the phase of the first clock CKI attains the phase I. The frequency difference signal FDO which indicates the standby state Stay is a 2-bit signal and corresponds to the signal value "11". The time period in which the PFD 16 outputs the frequency difference signal FDO indicating the standby state Stay is the time period in which the phase of the first clock CKI changes from phase I to phase IX in FIG. 8B.

When the frequency of the first clock CKI is higher than the frequency of the input data DIN, the signal values corresponding to the first phase signal PDI and the second phase signal PDQ change in the following order: (PDI/PDQ) =1/1→0/1→0/0→1/0. The PFD 16 detects the presence of the falling state Down, in which the frequency of the first clock CKI is falling, in response to the change of the signal value corresponding to the first phase signal PDI from "0" to "1" when the signal value corresponding to the second phase signal PDQ is "0", and the PFD 16 holds the falling state Down. When the signal value corresponding to the first phase signal PDI changes to "0", the PFD 16 detects the standby state Stay in which the frequency of the first clock CKI does not change. The PFD 16 outputs, to the CP 13, the frequency difference signal FDO which indicates the falling state Down over the period while the signal value corresponding to the first phase signal PDI is "1". The frequency difference signal FDO which indicates the falling state Down is a 2-bit signal and corresponds to the signal value "01". The time period in which the PFD 16 outputs the frequency difference signal FDO indicating the falling state Down is the time period in which the phase of the first clock CKI changes from phase IX to phase I in FIG. 8C. The PFD 16 outputs the frequency difference signal FDO which indicates the standby state Stay when the phase of the first clock CKI attains the phase I. The frequency difference signal FDO which indicates the standby state Stay is a 2-bit signal and corresponds to the signal value "11". The time period in which the PFD 16 outputs the frequency difference signal FDO indicating the standby state Stay is the time period in which the phase of the first clock CKI changes from phase I to phase IX in FIG. 8C.

The PFD 16 detects either of the rising state Up or the falling state Down of the frequency of the first clock CKI while the phase of the first clock CKI changes from the phase I to the phase IX. The PFD 16 outputs the frequency difference signal FDO indicating the rising state Up or the falling state Down in response to the detected state while the phase changes from the phase IX shifted by π from the phase in which the rising state Up and the falling state Down are detected, to the phase I. The PFD 16 detects the standby state Stay while the phase of the first clock CKI changes from the phase IX to the phase I. The PFD 16 outputs the frequency difference signal FDO indicating the standby state Stay in the period while the phase changes from the phase I that is shifted by π from the phase in which the standby state Stay is detected, to the phase IX.

FIG. 12A illustrates operations of the PFD 16 when the frequency of the first clock CKI is lower than the frequency of the input data DIN and jitter occurs. FIG. 12B illustrates operations of the PFD 16 when the frequency of the first clock CKI is higher than the frequency of the input data DIN and jitter occurs. In FIG. 12A and FIG. 12B, "R" signifies a read mode, "L" signifies a latch mode, "Stay" signifies a standby state, "Up" signifies a rising state, and "Down" signifies a falling state.

As illustrated in FIG. 12A, when the signal value corresponding to the second phase signal PDQ is "0", the PFD 16 outputs the frequency difference signal FDO which indicates the standby state Stay when the signal value corresponding to the first phase signal PDI changes from "0" to "1" due to the effect of jitter. Moreover, when the signal value corresponding to the second phase signal PDQ is "1", the PFD 16 outputs the frequency difference signal FDO which indicates the standby state Stay instead of the rising state Up when the signal value corresponding to the first phase signal PDI changes from "1" to "0" due to the effect of jitter. Next, the PFD 16 outputs the frequency difference signal FDO which indicates the rising state Up when the signal value corresponding to the first phase signal PDI changes from "0" to "1".

As illustrated in FIG. 12B, when the signal value corresponding to the second phase signal PDQ is "0", the PFD 16 outputs the frequency difference signal FDO which indicates the standby state Stay when the signal value corresponding to the first phase signal PDI changes from "1" to "0" due to the effect of jitter. Moreover, when the signal value corresponding to the second phase signal PDQ is "1", the PFD 16 outputs the frequency difference signal FDO which indicates the standby state Stay instead of the falling state Down when the signal value corresponding to the first phase signal PDI changes from "0" to "1" due to the effect of jitter. Next, the PFD 16 re-outputs the frequency difference signal FDO which indicates the falling state Down when the signal value corresponding to the first phase signal PDI changes from "1" to "0".

Figure 13:
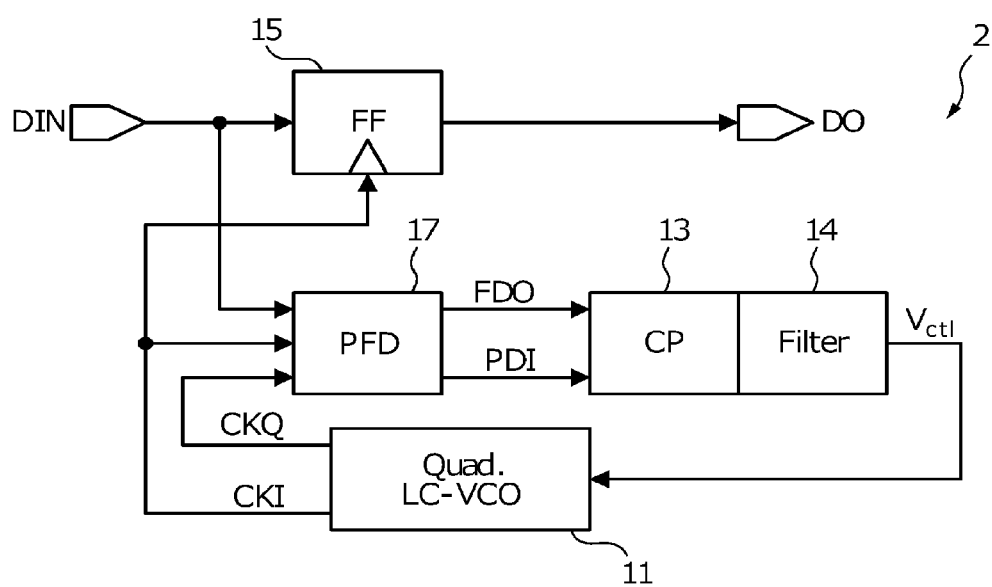
FIG. 13 is a circuit block diagram of a clock data recovery circuit according to a second embodiment.

FIG. 13 is a circuit block diagram of a CDR circuit according to a second embodiment.

A CDR circuit 2 differs from the CDR 100 in that a PFD 17 is disposed in place of the PFD 12. The functions and configurations of the constituent elements of the CDR circuit 2 other than the constituent elements in the PFD 17 are the same as the functions and configurations of the constituent elements of the CDR circuit 100 attributed with the same reference numerals and thus detailed explanations will be omitted.

FIG. 14 is an internal circuit block diagram of the PFD 17.

The PFD 17 is achieved by using the output signals of the PFD 12 that operates as explained above with reference to FIG. 8. The PFD 17 is provided with an original frequency detector 41, first to third double edge flip-flops 42-44, and a logical circuit 45, and differs from the PFD 12 in this way. The functions and configurations of the PFD 17 other than the original frequency detector 41, the first to third double edge flip-flops 42-44, and the logical circuit 45 are the same as the functions and configurations of the constituent elements of the PFD 12 attributed with the same reference numerals. Therefore, detailed explanations of the functions and configurations of the constituent elements PFD 17 other than the original frequency detector 41, the first to third double edge flip-flops 42-44, and the logical circuit 45 will be omitted.

The original frequency detector 41 has the same configuration as the PFD 12 and a detailed explanation will be omitted. The original frequency detector 41 functions as a state detector for detecting whether the state is the rising state Up or the falling state Down when the phase of the first clock CKI is the phase I. The original frequency detector 41 outputs a detection frequency difference signal FDO1 to the first double edge flip-flop 42.

The first phase latch circuit 24 and the second phase latch circuit 25 in the original frequency detector 41 function as state detectors for detecting the state at the phase IX. The frequency detection multiplexer 26 functions as a frequency detector for generating and outputting a detection frequency difference signal which indicates any of the rising state Up, the falling state Down, or the standby state Stay based on the state detected by the state detectors.

Each of the first to third double edge flip-flops 42-44 is a flip-flop that latches the input data at both of the rising edge and the falling edge of the first phase signal PDI and outputs the latched data.

The first double edge flip-flop 42 latches the detection frequency difference signal FDO1 at both edges of the rising edge and the falling edge of the first phase signal PDI and outputs the latched detection frequency difference signal FDO1 as a first intermediate signal F11 to the second double edge flip-flop 43 and the logical circuit 45. The second double edge flip-flop 43 latches the first intermediate signal F11 at both of the rising edge and the falling edge of the first phase signal PDI and outputs the latched first intermediate signal F11 as a second intermediate signal F12 to the third double edge flip-flop 44 and the logical circuit 45. The third double edge flip-flop 44 latches the second intermediate signal F12 at both of the rising edge and the falling edge of the first phase signal PDI and outputs the latched second intermediate signal F12 as a frequency difference signal FDO2 to the CP 13 and the logical circuit 45.

Table explains the operations of the logical circuit 45.

| F11 | F12 | FD02 | Processing |
|-----|-----|------|------------|
| 01  | 10  | —    | Change F12 to 11 |
| 10  | 01  | —    | Change F12 to 11 |
| —   | 11  | 10   | Change F12 to 10 |
| —   | 11  | 01   | Change F12 to 01 |

The logical circuit 45 determines that a false detection has occurred due to jitter when the PFD 17 detects a change between the rising state Up and the falling state Down without the standby state Stay being interposed therein, and changes the output signal of the second double edge flip-flop 43.

The logical circuit 45 changes the signal value corresponding to the second intermediate signal F12 to "11" when the signal value corresponding to the first intermediate signal F11 is "01" and the signal value corresponding to the second intermediate signal F12 is "10". The logical circuit 45 changes the signal value corresponding to the second intermediate signal F12 to "11" when the signal value corresponding to the first intermediate signal F11 is "10" and the signal value corresponding to the second intermediate signal F12 is "01".

The logical circuit 45 changes the state corresponding to the second intermediate signal F12 to the standby state Stay when the first intermediate signal F11 corresponds to the rising state Up and the second intermediate signal F12 corresponds to the falling state Down. The logical circuit 45 changes the state corresponding to the second intermediate signal F12 to the standby state Stay when the first intermediate signal F11 corresponds to the falling state Down and the second intermediate signal F12 corresponds to the rising state Up.

The logical circuit 45 changes the signal value corresponding to the second intermediate signal F12 to "10" when the signal value corresponding to the second intermediate signal F12 is "11" and the signal value corresponding to the frequency difference signal FDO2 is "10". The logical circuit 45 changes the signal value corresponding to the second intermediate signal F12 to "01" when the signal value corresponding to the second intermediate signal F12 is "11" and the signal value corresponding to the frequency difference signal FDO2 is "01".

The logical circuit 45 changes the state corresponding to the second intermediate signal F12 to the rising state Up when the second intermediate signal F12 corresponds to the standby state Stay and the frequency difference signal FDO corresponds to the rising state Up. The logical circuit 45 changes the state corresponding to the second intermediate signal F12 to the falling state Down when the second intermediate signal F12 corresponds to the standby state Stay and the frequency difference signal FDO corresponds to the falling state Down.

Figure 15:
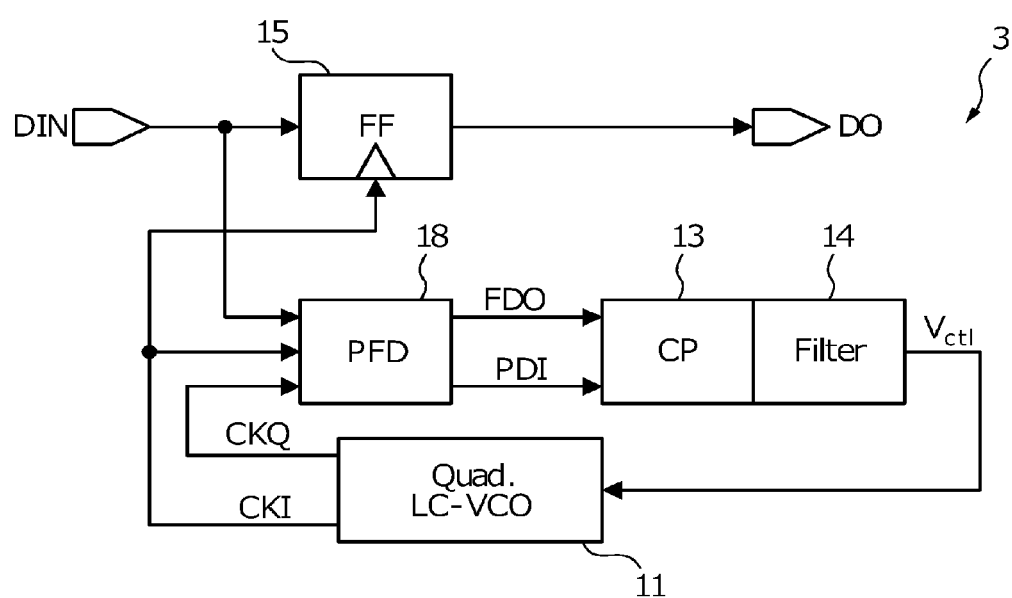
FIG. 15 is a circuit block diagram of a clock data recovery circuit according to a third embodiment.

FIG. 15 is a circuit block diagram of a CDR circuit according to a third embodiment.

A CDR circuit 3 differs from the CDR 100 in that a PFD 18 is disposed in place of the PFD 12. The functions and configurations of the constituent elements of the CDR circuit 3 other than the PFD 18 are the same as the functions and configurations of the constituent elements of the CDR circuit 100 attributed with the same reference numerals and thus detailed explanations will be omitted.

Figure 16:
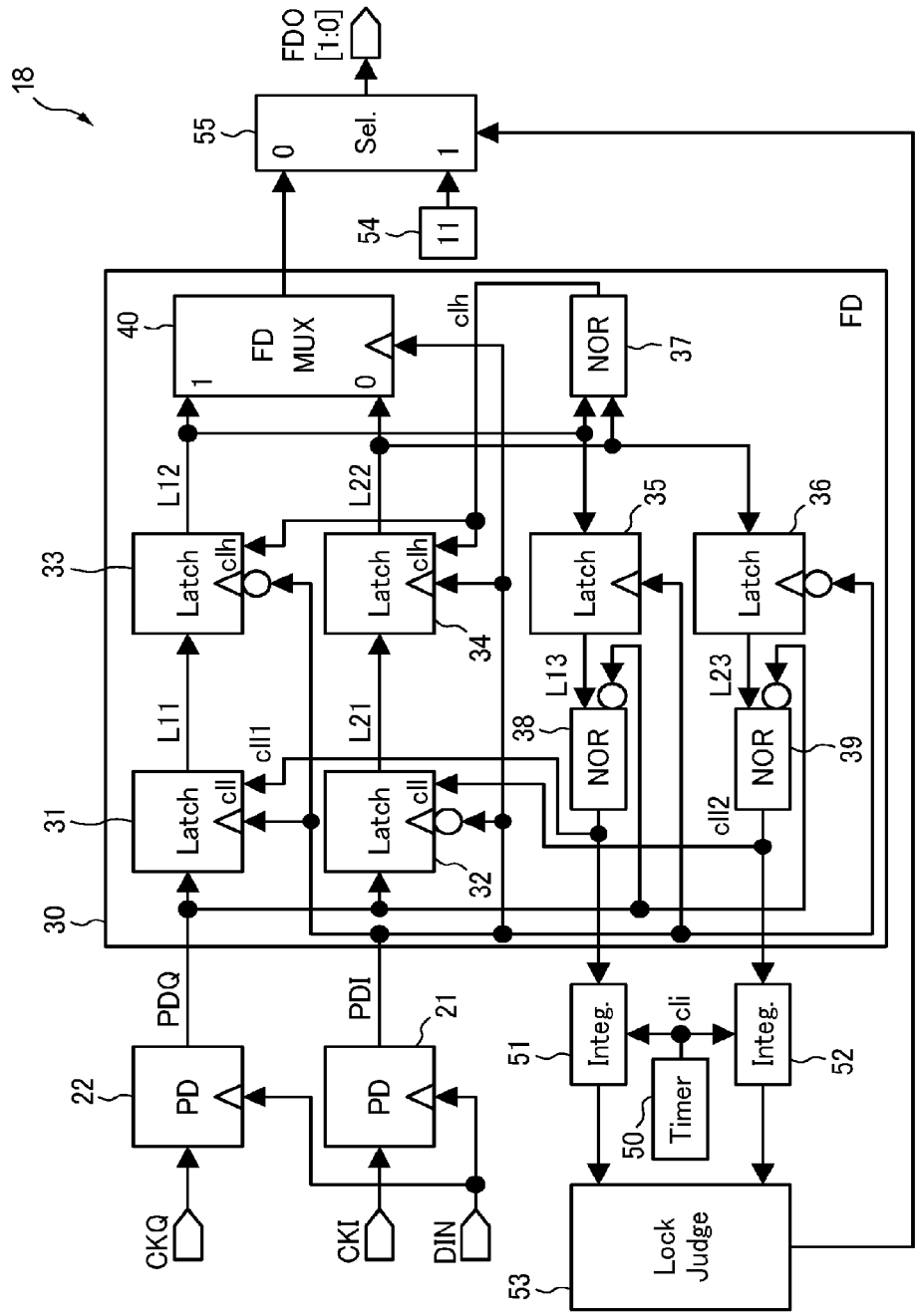
FIG. 16 is an internal circuit block diagram of the phase frequency detector illustrated in FIG. 15.

FIG. 16 is an internal circuit block diagram of the PFD 18.

The PFD 18 has a configuration for fixing the signal value of the frequency difference signal FDO to "11" which indicates the standby state Stay after it has been determined that the frequency of the input data DIN and the frequency of the first clock CKI match, and thus differs from the PFD 16. The PFD 18 has a timer 50, a first integrated circuit 51, a second integrated circuit 52, a lock jitter circuit 53, a data recording circuit 54, and a selector 55. The functions and configurations of the constituent elements of the PFD 18 other than the timer 50 and the first integrated circuit 51 to the selector 55 are the same as the functions and configurations of the constituent elements of the PFD 16 attributed with the same reference numerals and thus detailed explanations will be omitted.

The timer 50 counts a predetermined integration time and outputs an integration clear signal cli to the first integrated circuit 51 and the second integrated circuit 52 at each unit of the integration time. The first integrated circuit 51 counts the first clear low signal cll1 input at each unit of the integration time and outputs, to the lock jitter circuit 53, a first integration signal which indicates the count number. The second integrated circuit 52 counts the second clear low signal cll2 input at each unit of the integration time and outputs a second integration signal indicating the count number to the lock jitter circuit 53.

The lock jitter circuit 53 determines whether the count numbers corresponding to the respective first integration signal and the second integration signal are equal to or greater than a predetermined count threshold value. When the lock jitter circuit 53 determines that the count numbers corresponding to the respective first integration signal and the second integration signal are less than the predetermined count threshold value, the lock jitter circuit 53 outputs an asynchronous signal to the selector 55. When the lock jitter circuit 53 determines that the count numbers corresponding to the respective first integration signal and the second integration signal are equal to or greater than the predetermined count threshold value, the lock jitter circuit 53 outputs a synchronous signal to the selector 55.

After the frequencies and phases of the input data DIN and the first clock CKI are synchronized, the phase of the first clock CKI is in a state of oscillating near the phase IX, and therefore the signal values of the first clear low signal cll1 and the second clear low signal cll2 are frequently "1". The lock jitter circuit 53 determines that the frequencies and the phases of the input data DIN and the first clock CKI are synchronized when the count number, in which the signal values of the first clear low signal cll1 and the second clear low signal cll2 frequently becomes "1", is equal to or greater than the predetermined count threshold value.

The timer 50, the first integrated circuit 51, the second integrated circuit 52, and the lock jitter circuit 53 function as a synchronization determining circuit for determining whether the input data DIN and the first clock CKI are synchronized.

The data recording circuit 54 stores the signal value "11".

The selector 55 outputs the signal input from the PFD 16 as the frequency difference signal FDO when the asynchronous signal is input from the lock jitter circuit 53. The selector 55 outputs the signal indicating the signal value "11" input from the data recording circuit 54 as the frequency difference signal FDO when the synchronous signal is input from the lock jitter circuit 53.

The data recording circuit 54 and the selector 55 function as output changing circuits for changing the state corresponding to the frequency difference signal from the held state to the standby state Stay when the synchronization determination circuit determines that the input data DIN and the first clock CKI are synchronized.

The CDR circuit 3 fixes the state corresponding to the frequency difference signal FDO to the standby state Stay when the input data DIN and the first clock CKI are synchronized. After the synchronization, the CDR circuit 3 fixes the state corresponding to the frequency difference signal FDO to the standby state Stay and not to the rising state Up or the falling state Down. Therefore, there is no concern that the frequency difference signal FDO will affect the jitter characteristics after synchronization or that the jitter characteristics will deteriorate after synchronization.

Figure 17:
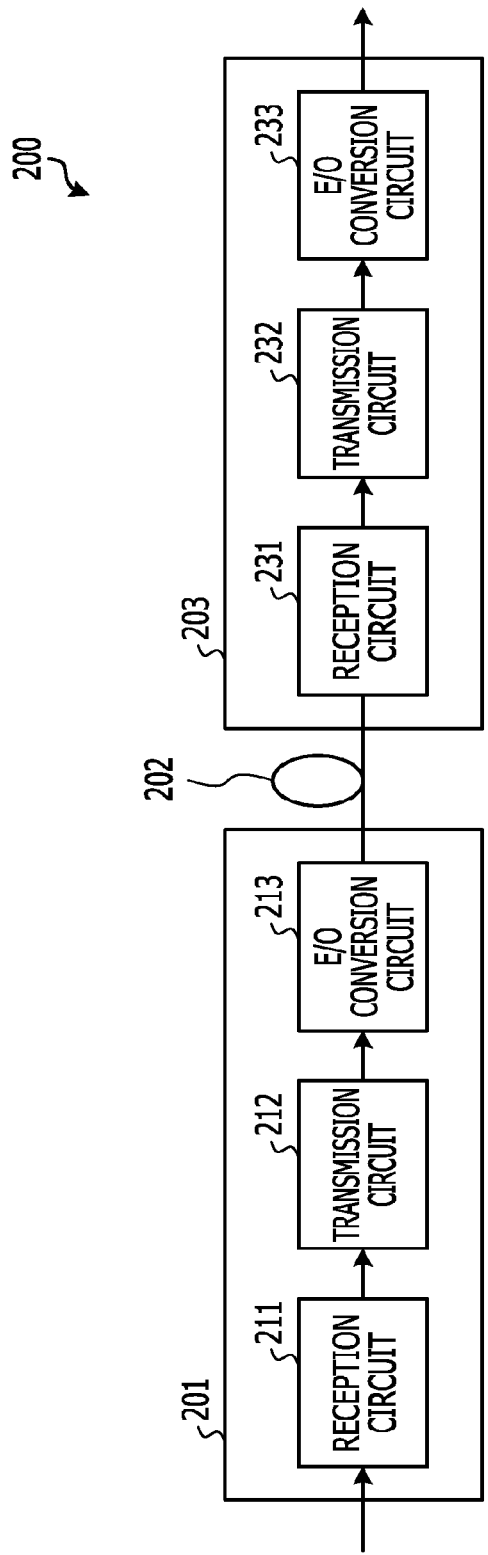
FIG. 17 illustrates a configuration of an optical communication system that uses the clock data recovery circuit according to the embodiments.

FIG. 17 illustrates a configuration of an optical communication system that uses the clock data recovery circuit according to the embodiments.

An optical communication system 200 has a transmitter 201 that converts transmission signals to optical signals and outputs the optical signals, an optical fiber 202 that transmits the optical signals from the transmitter 201, and a receiver 203 that receives the optical signals and generates reception signals. The transmitter 201 reproduces the transmission signal transmitted from an electronic device and generates optical signals. The transmitter 201 may also be a relay device that, after optical signals received via the optical fiber are converted to electrical signals, reconverts the electrical signals to optical signals. The receiver 203 outputs the reproduced reception signals as electrical signals to an electronic device and the like. The receiver 203 may also be a relay device that reconverts the reception signals to optical signals and outputs the optical signals.

The transmitter 201 has a reception circuit 211, a transmission circuit 212, and an E/O conversion circuit 213. The reception circuit 211 of the transmitter 201 receives electrical signals input from an electronic device that is not illustrated, the E/O conversion circuit 213 converts the transmission signals that have been generated by the transmission circuit 212 to optical signals, and the transmitter 201 transmits data through the optical fiber 202. The receiver 203 has an E/O conversion circuit 231, a reception circuit 232, and a transmission circuit 233. After the E/O conversion circuit 231 of the receiver 203 converts the received optical signals to electrical signals and the reception circuit 232 receives the data, the transmission circuit 233 generates transmission signals and transmits the data as electrical signals to an electronic device that is not illustrated.

The reception circuit 211 and the reception circuit 232 include the CDR circuit according to the embodiments and reproduce clocks from the reception data signals and reproduce the reception data signals.

The clock and data recovery (CDR) circuit according to the embodiments can be used in any circuit when reproducing clocks from data signals with a circuit that carries out transmission and reception of data signals that have been synchronized to a clock and modulated inside or outside of an electronic device, in addition to being useable in an optical communication system. For example, the clock and data recovery (CDR) circuit can be used in fields in which high-speed input/output (I/O) and optical communications are desired for the transmission and reception of signals within integrated circuit chips and between chips (or within devices, between devices).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock data recovery circuit comprising:
    an oscillator that outputs a first clock of which a frequency is variable and a second clock having the same frequency and a different phase of the first clock; and
    a feedback circuit that controls the oscillator so as to synchronize input data and the first clock in response to a phase difference and a frequency difference between the input data and the first clock, the feedback circuit including:
    a controller that controls the oscillator in response to a frequency difference signal which indicates a change command to change the frequency of the first clock and a phase difference signal which indicates a change command to change the phase of the first clock;
    a first difference detector that generates a first difference signal which indicates the phase difference between the input data and the first clock;
    a second difference detector that generates a second difference signal which indicates the phase difference between the input data and the second clock; and
    a frequency detector that outputs the frequency difference signal which indicates any one of a rising state in which the frequency of the first clock is rising, a falling state in which the frequency of the first clock is falling, and a standby state in which the frequency of the first clock is not changed, based on the first difference signal and the second difference signal, the frequency detector including:
    a state detector that detects one of the rising state or the falling state when the phase of the first clock is a first phase; and
    a state holder that holds a state detected in the first phase and outputs the frequency difference signal indicating the held state at a second phase that is different from the first phase.

2. The clock data recovery circuit according to claim 1, wherein
    the second phase is a phase in which the input data changes and the phase difference between the first phase and the second phase is it.

3. The clock data recovery circuit according to claim 1, wherein
    the state holder outputs the frequency difference signal indicating the standby state while the phase of the first clock changes from the first phase to the second phase, and outputs the frequency difference signal indicating the held state while the phase of the first clock changes from the second phase to the first phase.

4. The clock data recovery circuit according to claim 3, wherein
    the state holder continues to output the frequency difference signal which indicates the standby state when the state detector detects a change between the rising state and the falling state without the standby state being interposed therein while the frequency difference signal which indicates the standby state is being output.

5. The clock data recovery circuit according to claim 3, wherein
    the state holder outputs the frequency difference signal which indicates the standby state when the state detector detects a change between the rising state and the falling state without the standby state being interposed therein while the frequency difference signal which indicates the held state is being output.

6. The clock data recovery circuit according to claim 1, further comprising:
    a holder for holding a state detected at the first phase;
    a frequency difference signal generating circuit that generates and outputs the frequency difference signal which indicates any of the rising state, the falling state, and the standby state based on the held state;
    a holding state changing circuit that changes the state held by the holder to the standby state when the state detector detects a change between the rising state and the falling state without the standby state being interposed therein; and
    a detection state changing circuit that changes the state detected by the state detector to the state before the detection of the change between the rising state and the falling state when the state detector detects a change between the rising state and the falling state without the standby state being interposed therein.

7. The clock data recovery circuit according to claim 1, further comprising:
    a state detector that detects a state at the first phase; and
    a frequency difference signal generating circuit that generates and outputs a frequency difference signal which indicates any of the rising state, the falling state, and the standby state based on the state detected by the state detector, the state holder including
    a first holder that latches the detection frequency difference signal at a changing edge of both a rising edge and a falling edge of the first difference signal and outputs the latched detection frequency difference signal as a first intermediate signal;
    a second holder that latches the first intermediate signal at a changing edge of both of the rising edge and the falling edge of the first difference signal and outputs the latched first intermediate signal as a second intermediate signal;
    a third holder that latches the second intermediate signal at a changing edge of both of a rising edge and a falling edge of the first difference signal and outputs the latched second intermediate signal as the frequency difference signal; and
    a logical circuit that changes the second intermediate signal based on the first intermediate signal, the second intermediate signal, and the frequency difference signal, wherein the logical circuit
    changes the state corresponding to the second intermediate signal to the standby state when the first intermediate signal corresponds to the rising state and the second intermediate signal corresponds to the falling state and when the first intermediate signal corresponds to the falling state and the second intermediate signal corresponds to the rising state;

changes the state corresponding to the second intermediate signal to the rising state when the second intermediate signal corresponds to the standby state and the frequency difference signal corresponds to the rising state; and changes the state corresponding to the second intermediate signal to the falling state when the second intermediate signal corresponds to the standby state and the frequency difference signal corresponds to the falling state.

8. The clock data recovery circuit according to claim 1, further comprising:

a synchronization determining circuit that determines whether the input data and the first clock are synchronized; and an output changing circuit that changes the state corresponding to the frequency difference signal from the held state to the standby state when the synchronization determining circuit determines that the input data and the first clock are synchronized.

9. An electronic device comprising a clock data recovery circuit that recoveries a clock from received input data and taking the input data on the basis of the clock, the clock data recovery circuit including:

an oscillator that outputs a first clock of which a frequency is variable and a second clock having the same frequency and a different phase of the first clock; and a feedback circuit that controls the oscillator so as to synchronize input data and the first clock in response to a phase difference and a frequency difference between the input data and the first clock, the feedback circuit including:

a controller that controls the oscillator in response to a frequency difference signal which indicates a change command to change the frequency of the first clock and a phase difference signal which indicates a change command to change the phase of the first clock;

a first difference detector that generates a first difference signal which indicates the phase difference between the input data and the first clock;

a second difference detector that generates a second difference signal which indicates the phase difference between the input data and the second clock; and a frequency detector that outputs the frequency difference signal which indicates any one of a rising state in which the frequency of the first clock is rising, a falling state in which the frequency of the first clock is falling, and a standby state in which the frequency of the first clock is not changed, based on the first difference signal and the second difference signal, the frequency detector including:

a state detector that detects one of the rising state or the falling state when the phase of the first clock is a first phase; and a state holder that holds a state detected in the first phase and outputs the frequency difference signal indicating the held state at a second phase that is different from the first phase.

10. A clock data recovery method comprising:

outputting a first clock of which a frequency is variable and a second clock having the same frequency and a different phase of the first clock; and controlling so as to synchronize input data and the first clock in response to a phase difference and a frequency difference between the input data and the first clock;

controlling in response to a frequency difference signal which indicates a change command to change the frequency of the first clock and a phase difference signal which indicates a change command to change the phase of the first clock;

generating a first difference signal which indicates the phase difference between the input data and the first clock;

generating a second difference signal which indicates the phase difference between the input data and the second clock;

outputting the frequency difference signal which indicates any one of a rising state in which the frequency of the first clock is rising, a falling state in which the frequency of the first clock is falling, and a standby state in which the frequency of the first clock is not changed, based on the first difference signal and the second difference signal;

detecting one of the rising state or the falling state when the phase of the first clock is a first phase; and holding a state detected in the first phase and outputs the frequency difference signal indicating the held state at a second phase that is different from the first phase.

* * * * *